(12) United States Patent
Bozano et al.

(10) Patent No.: US 7,151,029 B2
(45) Date of Patent: Dec. 19, 2006

(54) MEMORY DEVICE AND METHOD OF MAKING THE SAME

(75) Inventors: Luisa Dominica Bozano, Los Gatos, CA (US); Kenneth Raymond Carter, San Jose, CA (US); John Campbell Scott, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/151,007

(22) Filed: Jun. 14, 2005

(65) Prior Publication Data

US 2005/0237834 A1   Oct. 27, 2005

Related U.S. Application Data

(62) Division of application No. 10/645,240, filed on Aug. 20, 2003, now Pat. No. 6,987,689.

(51) Int. Cl.
*H01L 21/336* (2006.01)
*G11C 11/00* (2006.01)

(52) U.S. Cl. ............. 438/257; 257/51.04; 365/148; 365/100

(58) Field of Classification Search ............. 365/148, 365/100, 113; 257/51.04; 977/742, 723
See application file for complete search history.

(56) References Cited

U.S. PATENT DOCUMENTS

| | | | | |
|---|---|---|---|---|
| 3,644,741 A * | 2/1972 | Ovshinsky | ............ | 250/214 LA |
| 4,110,839 A * | 8/1978 | Bert et al. | ............ | 365/180 |
| 4,242,697 A * | 12/1980 | Berthold et al. | ............ | 257/146 |
| 4,384,299 A * | 5/1983 | Raffel et al. | ............ | 257/324 |
| 4,503,521 A * | 3/1985 | Schick et al. | ............ | 365/182 |
| 4,710,899 A * | 12/1987 | Young et al. | ............ | 365/113 |
| 4,717,943 A * | 1/1988 | Wolf et al. | ............ | 257/324 |
| 5,150,226 A * | 9/1992 | Takanashi et al. | ............ | 358/471 |
| 5,306,586 A * | 4/1994 | Pai et al. | ............ | 430/58.5 |
| 5,541,869 A * | 7/1996 | Rose et al. | ............ | 365/100 |
| 6,055,180 A * | 4/2000 | Gudesen et al. | ............ | 365/175 |
| 6,128,214 A * | 10/2000 | Kuekes et al. | ............ | 365/151 |
| 6,194,759 B1 * | 2/2001 | Sano et al. | ............ | 257/314 |
| 6,504,755 B1 * | 1/2003 | Katayama et al. | ............ | 365/185.15 |
| 6,531,735 B1 * | 3/2003 | Kamigaki et al. | ............ | 257/324 |
| 6,620,717 B1 * | 9/2003 | Kamal et al. | ............ | 438/587 |
| 6,653,190 B1 * | 11/2003 | Yang et al. | ............ | 438/258 |
| 6,974,965 B1 * | 12/2005 | Li | ............ | 257/2 |
| 2002/0066933 A1 * | 6/2002 | Tsu-Jae | ............ | 257/410 |
| 2003/0015752 A1 * | 1/2003 | Palm et al. | ............ | 257/315 |

\* cited by examiner

*Primary Examiner*—Long Tran
(74) *Attorney, Agent, or Firm*—Samuel A. Kassatly

(57) ABSTRACT

A multi-stable memory or data storage element is used in crosspoint data-storage arrays, as a switch, a memory device, or as a logical device. The general structure of the multi-stable element comprises a layered, composite medium that both transports and stores charge disposed between two electrodes. Dispersed within the composite medium are discrete charge storage particles that trap and store charge. The multi-stable element achieves an exemplary bi-stable characteristic, providing a switchable device that has two or more stable states reliably created by the application of a voltage to the device. The voltages applied to achieve the "on" state, the "off" state, any intermediate state, and to read the state of the multi-stable element are all of the same polarity.

17 Claims, 12 Drawing Sheets

MEMORY DEVICE AND METHOD OF MAKING THE SAME

The present invention application is a divisional of, and claims the priority of, U.S. patent application Ser. No. 10/645,240, filed on Aug. 20, 2003 now Pat. No. 6,987,689, titled "Non-Volatile Multi-Stable Memory Device and Methods of Making and Using the Same," which is incorporated herein by reference.

FIELD OF THE INVENTION

The present invention generally relates to memory and storage systems, and particularly to a crosspoint data storage array utilizing a multi-stable device. Specifically, this invention pertains to a multi-stable device comprising a layered, composite medium that utilizes a layer of discrete charge storage particles within the composite medium, to create a device with multiple stable and reproducible values of resistance suitable, for use, for example, as a memory storage device, a switch, or a logical circuit.

BACKGROUND OF THE INVENTION

The two conventional common non-volatile data storage devices are: disk drives and solid state random access memories (RAMs). Disk drives are capable of inexpensively storing large amounts of data, i.e., greater than 100 GB. However, disk drives are inherently unreliable. A hard drive includes a fixed read/write head and a moving media upon which data is written. Devices with moving parts tend to wear out and fail. In addition, access times for hard drives are relatively slow. Solid state random access memories have faster access times and currently store data on the order of 1 GB (gigabyte) per device, but are relatively more expensive per storage unit, i.e., per 1 GB, compared to a disk drive.

The most common type of solid state RAM is Flash memory. Flash memory relies on a thin layer of polysilicon that is disposed in oxide below a transistor's on-off control gate. This layer of polysilicon is a floating gate, isolated by the insulator, typically silicon dioxide, from the control gate and the transistor channel. Flash memory is relatively slow, with writing times on the order of a microsecond. In addition, flash memory cells could begin to lose data after less than a million write cycles. While this may be adequate for some applications, flash memory cells would begin to fail rapidly if used constantly to write new data, such as in a computer's main memory. Further, the access time for flash memory is much too long for computer applications.

Another form of RAM is the ferroelectric RAM, or FRAM. FRAM stores data based on the direction that ferroelectric domains point. FRAM has access times much faster than Flash memory and consumes less energy than standard dynamic random access memory (DRAM). However, commercially available memory capacities are currently low, on the order of 0.25 MB (megabyte). In addition, memory storage in a FRAM relies on physically moving atoms, leading to eventual degradation of the medium and failure of the memory.

Yet another form of RAM is the Ovonic Unified Memory (OUM) that utilizes a material that alternates between crystalline and amorphous phases to store data. The material used in this application is a chalcogenide alloy. After the chalcogenide alloy experiences a heating and cooling cycle, it could be programmed to accept one of two stable phases: polycrystalline or amorphous. The variation in resistance of the two phases leads to the use of the chalcogenide alloy as memory storage. Data access time is on the order of 50 ns. However, the size of these memories is still small, on the order of 4 MB currently. In addition, OUM relies on physically changing a material from crystalline to amorphous; this physical change may likely cause the material to eventually degrade and fail.

Semiconductor magnetoresistive RAM (MRAM) stores data as direction of magnetic moment in a ferromagnetic material. Atoms in ferromagnetic materials respond to external magnetic fields, aligning their magnetic moments to the direction of the applied magnetic field. When the field is removed, the atoms' magnetic moments still remain aligned in the induced direction. A field applied in the opposite direction causes the atoms to realign themselves with the new direction. Typically, the magnetic moments of the atoms within a volume of the ferromagnetic material are aligned parallel to one another by a magnetic exchange interaction. These atoms then respond together, largely as one macro-magnetic moment, or magnetic domain, to the external magnetic field.

One approach to MRAM uses a magnetic tunneling junction as the memory cell. The magnetic tunneling junction comprises two layers of ferromagnetic material separated by a thin insulating material. The direction of the magnetic domains is fixed in one layer. In the second layer, the domain direction is allowed to move in response to an applied field. Consequently, the direction of the domains in the second layer can either be parallel or opposite to the first layer, allowing the storage of data in the form of ones and zeros. However, currently available MRAM can only store up to 1 Mb (megabit), much less than needed for most memory applications.

One alternative to current memory devices utilizes crosspoint memory arrays. In a crosspoint array, the storage medium is sandwiched between two sets of electrodes running in perpendicular directions. Thus, each element is at the intersection of one line (the word line) below and one line (the bit line) above and is addressed when a suitable voltage is applied between the two lines. The simplest memory scheme for such an element is a resistive switch that can be set to two or more resistance values by the application of a voltage or current pulse and then later read at a different voltage. The storage medium should exhibit a bi- or multi-stable behavior. In addition, the storage medium should switch at speeds fast enough to compete with hard drives at minimum. Further, the storage medium should retain its state for many years.

Viable candidates for application as memory technologies should be non-volatile unlike DRAM, and relatively inexpensive (compared to Flash) and with faster access times and greater mechanical reliability than disk drives. Crosspoint memory arrays promise to satisfy many of these requirements, and much effort is being applied in many research labs to develop a suitable storage medium. Reference is made to U.S. Pat. No. 6,055,180 to Gudesen et al.

Several candidates for such a bi-stable (or multi-stable) resistive switching element for use in crosspoint memory arrays have been described in the literature, but none has yet proved suitable for technological application. Resistive switches have been described by Y. Yang et al. PCT patent application No. WO02/37500 A1; and L. P. Ma et al. Appl. Phys. Lett., 80(16), 2997–2999, (2002), in which three layers (organic/metal/organic) are sandwiched between the electrodes. However, this structure does not consistently exhibit the bi-stable behavior required for crosspoint memory arrays nor are the characteristics of the device easily adjustable by rational design. In addition, both negative and positive voltage pulses are used to set the resistance of the device, increasing the complexity of the logic circuitry used to address the device in a crosspoint array.

Another memory device has been developed that utilizes a mechanism for multi-stable resistance behavior in which charge is trapped in a semi-conductive layer, is described in Simmons and Verdeber, Proc. Roy. Soc. A, 391, 77–102, (1967). The resulting electric field inhibits further injection at the electrode. In these metal-insulator-metal devices, an "electro-forming" step is required. This process comprises applying a relatively large voltage across the device that is believed to catastrophically destroy some fraction of the top electrode and deposit the metal as atoms and clusters of atoms into the insulating film. These atoms and clusters of atoms transport charge and act as charge storage centers. However, the electro-forming step is difficult to control and behavior of the device is not sufficiently predictable or reproducible for use in a memory device.

Another storage medium that comprises conjugated polymers, doped with ionic species to render it more or less conductive is described in Krieger et al., Proc. 6th Foresight Conf. on Molecular Electronics, (1998).

Another storage medium that utilizes a memory device comprising an alloy of silver with GeS or GeSe is described in Kozicki et al., Arizona State Univ. and Axon Corp., "Superlattices and Microstructures," 27(5–6), 485–488, (2000). Electrochemical reduction of the silver creates metallic silver deposits that eventually percolate across the semi-conducting layer to form highly conducting pathways. This process can be reversed, re-oxidizing the silver and re-dissolving it in the semi-conductive matrix. Both of these memory media are inherently filamentary conductors where the current is concentrated in a few pathways connecting the electrodes, limiting the scalability of these devices to small dimensions. In addition, breakdown of the filaments would lead to catastrophic failure of the memory device.

What is therefore needed is a memory device that complements and/or replaces the existing product classes of DRAM, Flash, and hard drives. A storage device utilizing this memory device should be non-volatile, relatively inexpensive to produce in mass, and have greater reliability than hard drives. This memory device should have reproducible and predictable characteristics. The need for such a device has heretofore remained unsatisfied.

SUMMARY OF THE INVENTION

The present invention satisfies this need, and presents a class of bi-stable/multi-stable memory or data storage elements for use in crosspoint data-storage arrays. The present invention may also be used as a switch or as a logical device. The logical device would incorporate the switch into a computer gate, latch, or register with a crosspoint architecture. The general structure of the present invention comprises a layered, composite medium that both transports and stores charge. This composite medium is disposed between two electrodes, and is made of a semi-conductive material that is primarily responsible for conducting charge between the two electrodes. Dispersed within the composite medium are "discrete" (that is substantially separate, or non-percolating) charge storage particles that trap and store charges.

The present invention achieves a multi-stable characteristic, providing a switchable device that has two or more stable states reliably created by applications of voltages of the same polarity, to the device. In an important feature of the present invention, the voltages applied to the present invention to achieve the "on" state, the "off" state, or any intermediate state, and to read the state of the present invention are all of the same polarity. The present invention is stable, cyclable, and reproducible in the "on" state, the "off" state, and any intermediate state. The present invention is cyclable in that it can be set to one state; it can read that state as often as desire; it can be switched to another state; and it can further read the latter state as often as desired.

In one embodiment, the electrode materials are selected in conjunction with the semi-conductive materials such that only one electrode injects charge into the semi-conductive material. Consequently, only electron charges but not holes can migrate through the present device, or vice versa.

In its "on" state, it is desirable that the present device passes much more current in one polarity than in the other. This feature is important for the operation of the present invention as a memory device, in that significant rectification is helpful for addressing large arrays, enabling the use of simple passive matrix addressing schemes to write data to the elements of the array. The present invention permits the possibility of achieving intrinsic rectification in the memory element itself by the suitable choice of electrode materials, but it does not preclude the use of a separate rectifying element, such as a diode in series with the device. The current in the on-state is larger for forward bias than for reverse bias, such rectification being achieved either by asymmetry in the fabrication of the device, or by the inclusion of a separate rectifying element in series.

Either organic or inorganic semiconductors may be used as the principle component of the composite medium; the process for depositing the material is chosen accordingly. Either thermal (e.g., vacuum) evaporation or solution (e.g., spinning) techniques may be used for the deposition of the semiconductor. These processing techniques result, in general, in an amorphous semi-conducting material. Furthermore, many of the materials that may be used in the present invention are wide-bandgap semiconductors; i.e., the energy difference between the valence levels (highest occupied molecular orbitals) and conduction levels (lowest unoccupied molecular orbitals) is more than 2.5 eV.

The discrete charge storage particles may be metallic grains or metallic nano-particles, semi-conductive particles with energy levels that differ from those of the host, or molecular or atomic impurities that form deep traps within the bandgap of the host material. The particles can be thermally evaporated either as a granular, discontinuous layer within the semi-conducting composite medium or co-deposited with the composite medium. Alternatively, nano-particles may be deposited by spinning from the same solution as the (organic) composite medium. While the discrete charge storage particles are included primarily to trap and store charges, these particles may additionally provide another charge transport channel, where the charge carriers tunnel between them. Charge transport can occur either through the conduction (electrons) or valence (holes) band of the semiconductor, or by "hopping" among the particles if they are distributed along the conduction direction. To the extent that the particles are all in a single layer, and if the layer has some thickness, it may provide an additional mechanism (channel) for conduction.

An advantageous feature of the present invention is that the storage medium has a relatively high resistance in its multiple states. Consequently, a dense array can be fabricated without significant cross-talk between adjacent elements. No patterning of the layer of storage medium is required. Furthermore, the high and low resistance levels of the memory element can be readily adjusted in the design of the device, not only by choice of the electrode, transport and storage materials, but also through the thickness of the various layers within the structure and by the concentration of charge storage sites.

Another advantageous feature of the present invention is that the wide range of materials that can be used for the two parts of the composite material permits trade-offs among various processing conditions and among various operating characteristics. For example, exclusively inorganic materials may be used if the devices should withstand high temperature processing in subsequent manufacturing steps. Simple solution coating may also be employed to reduce the cost of manufacturing the present invention.

In addition, all the processing steps in the fabrication of the present device are well-controlled thin-film deposition procedures. Further, the design of the present invention is well understood and the effect of various materials and manufacturing techniques on the present invention can be predicted. For example, if longer charge retention times are desired, one should use a wider bandgap semiconductor and choose discrete charge storage particles with energy levels deep in that gap.

The memory element of the present invention does not depend on filamentary conduction. Consequently, the present device scales more readily to small dimensions and is less prone to failures caused by catastrophic breakdown of the filaments.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

DETAILED DESCRIPTION OF PREFERRED EMBODIMENTS

Figure 1:
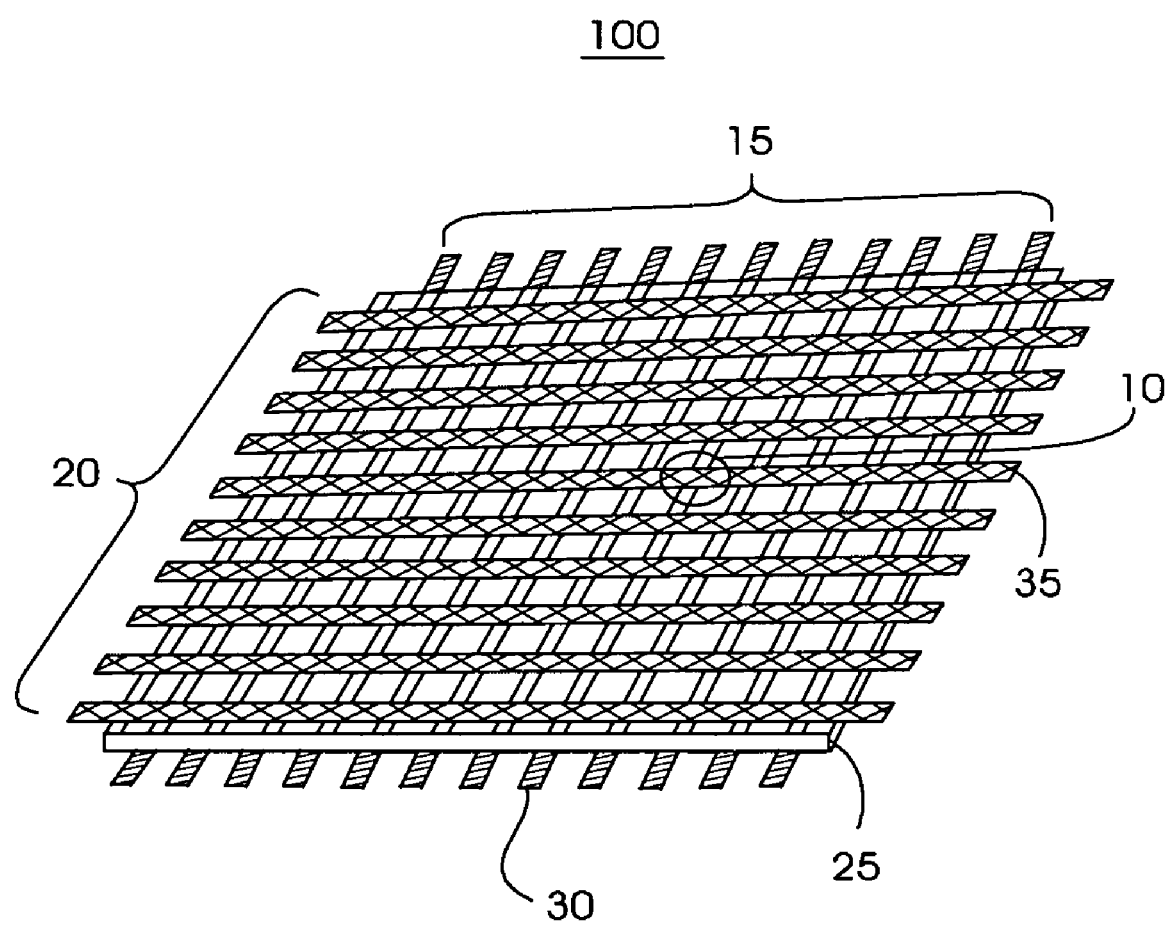
FIG. 1 is a schematic illustration of an exemplary operating environment in which a multi-stable memory system of the present invention can be used.

FIG. 1 illustrates an exemplary high-level architecture of a crosspoint memory array (or system) 100 comprised of a plurality of multi-stable devices 10 may be used. When used as a memory device, the multi-stable device 10 performs at one of two different electrical resistance values, an "on" value or an "off" value, that can be externally set by applying a voltage pulse to the multi-stable device 10. The "on" value may, for example, represent a "1" bit while the "off" value may represents a "0" bit of data. The resistance of the multi-stable device 10 can be read by applying a lower voltage to the multi-stable device 10; the "read" voltage does not affect the state of the multi-stable device 10.

The crosspoint memory array 100 is formed of an array of electrodes 15 and electrodes 20 that are disposed perpendicularly relative to each other. Electrodes 15 and electrodes 20 may also be disposed at any other relative angular orientations, such that electrodes 15, 20 intersect.

A multi-stable charge storage medium, storage medium 25, is sandwiched between electrodes 15, 20. Consequently, each memory device, such as the multi-stable device 10, is at the intersection of one line (the word line) below and one line (the bit line) above. For example, the multi-stable device 10 comprises a word-line electrode 30 and a bit-line electrode 35. The multi-stable device 10 is addressed when a suitable voltage is applied between electrode 30 and electrode 35.

Figure 2:
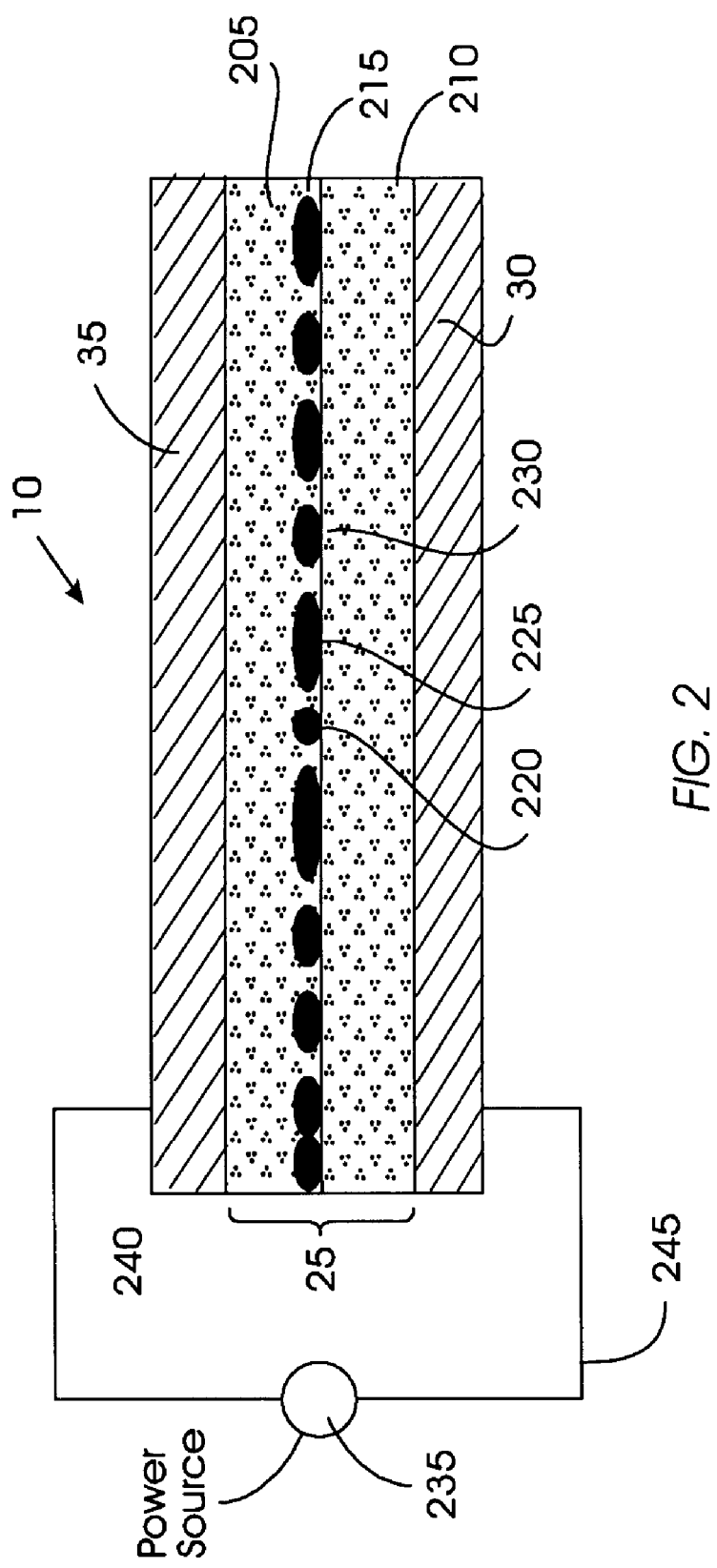
FIG. 2 is a schematic, cross-section view of the multi-stable memory device of FIG. 1, shown utilizing a layer of discrete charge storage particles.

The structure of the multi-stable device 10 is illustrated by the diagram of FIG. 2. The multi-stable device 10 comprises the storage medium 25 that is disposed between electrode 30 and electrode 35. The storage medium 25 comprises a first layer 210, a second layer 205, and a charge trapping layer 215.

Layers 205, 210 are comprised of semi-conductive material. The charge trapping layer 215 is comprised of discrete charge storage particles, such as particles 220, 225, and 230. The discrete charge storage particles 220, 225, 230 do not interconnect with each other to form conductive paths, and are embedded at the interface between layers 205, 210. This composite structure of the storage medium 25 is placed between electrode 30 and electrode 35 and connected to an external source and sense circuitry 235 by conductive leads 240, 245.

Figure 3:
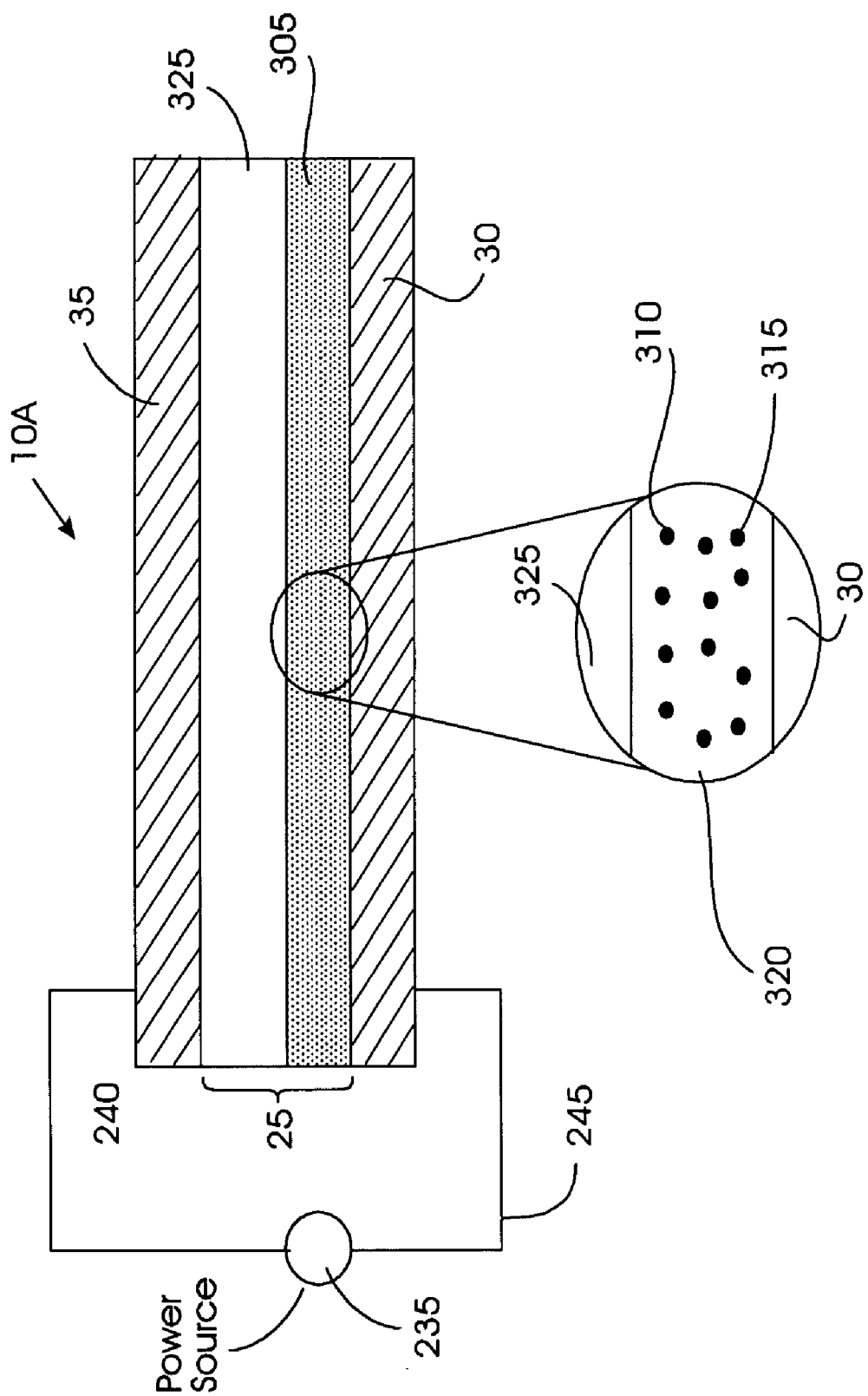
FIG. 3 is a schematic diagram of an alternate embodiment of the multi-stable memory device of FIG. 1 utilizing a semi-conductive layer with dispersed discrete charge storage particles.

In an alternative embodiment, a multi-stable device 10A is illustrated by the diagram of FIG. 3. The multi-stable device 10A comprises an upper semiconductor layer 325, and a lower dispersed layer 305 that comprises a dispersion of discrete charge storage particles 310, 315, 320, embedded in a semiconducting host material.

The multi-stable device 10A comprises a dispersion free upper semiconductor layer, layer 325, that is free of such discrete charge storage particles. As before, the multi-stable device 10A comprises electrode 30 and electrode 35, and the multi-stable device 10A is connected to the external source and sense circuitry 235 by conductive leads 240, 245. The placements of the dispersed layer 305 and layer 325 within the multi-stable device 10A may be exchanged. The optimum placement of the dispersed layer 305 and layer 325 depends on the nature of the electrodes 30, 35.

Figure 4:
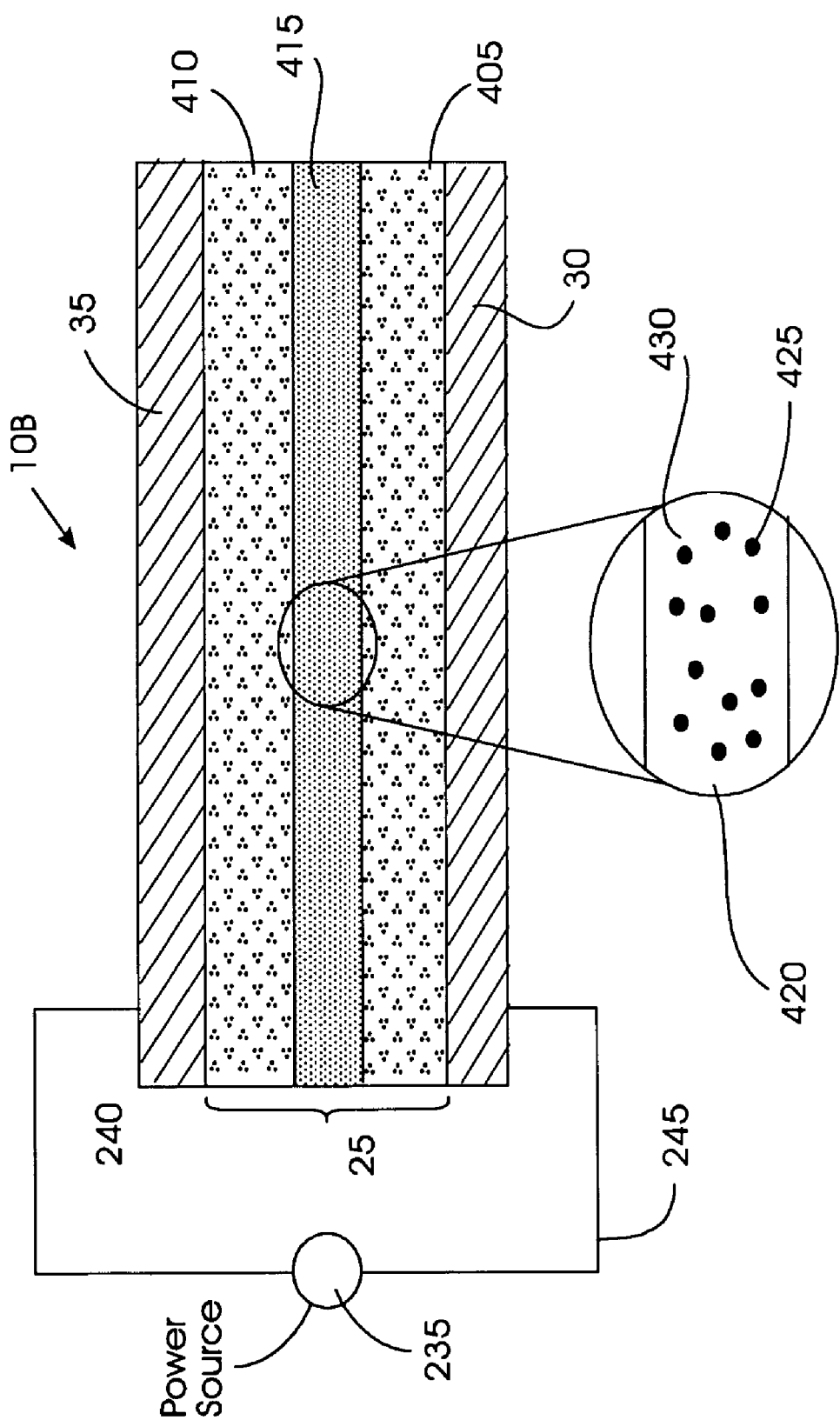
FIG. 4 is a schematic diagram of a further alternate embodiment of the multi-stable memory device of FIG. 1 utilizing a semi-conductive layer with dispersed discrete charge storage particles.

In another embodiment, a multi-stable device 10B is depicted in FIG. 4. The multi-stable device 10B comprises a lower semiconductor layer, layer 405, an upper semiconductor layer, layer 410, and a dispersed layer 415. The dispersed layer 415 comprises a semiconductor that contains a dispersion of discrete charge storage particles 420, 425, 430. Layers 405 and 410 do not contain charge storage particles. As before, the multi-stable device 10B comprises electrode 30 and electrode 35, and the multi-stable device 10B is connected to the external source and sense circuitry 235 by the conductive leads 240, 245. Layers 405, 410, and 415 may, in general, be of different thickness, and either or both of layers 405 and 410 may be omitted.

Figure 5:
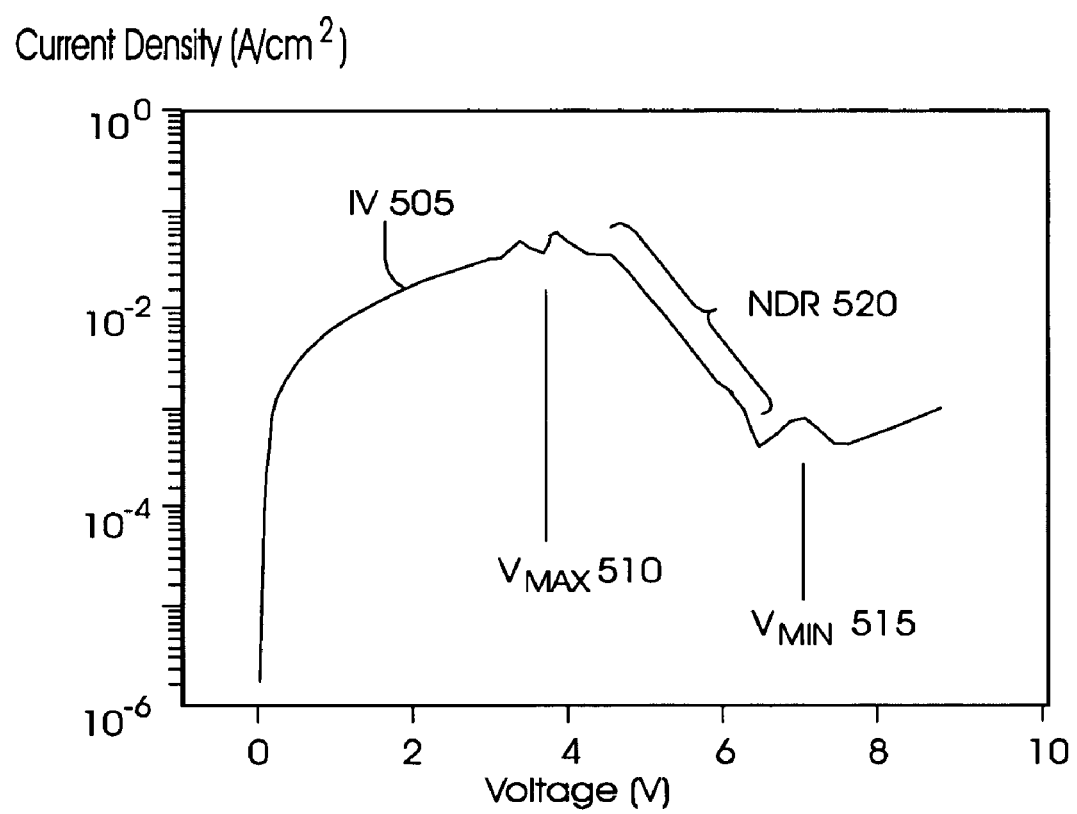
FIG. 5 is a graph illustrating the IV characteristic of the multi-stable memory device of FIGS. 1 and 2.

The behavior of the multi-stable device 10 can be determined by applying various voltage sequences and measuring the resulting current as a function not only of the applied voltage but also of the voltage history. The device characteristics of the multi-stable device 10 may be described in terms of an exemplary current-voltage characteristic (graph IV 505) of FIG. 5.

Graph IV 505 is obtained by slowly sweeping the applied voltage downward from a maximum value. As shown, the IV characteristic of graph IV 505 is shaped like an "N" in that there is a local maximum in the current at some low applied voltage ($V_{MAX}$ 510), and a local minimum at somewhat higher voltage ($V_{MIN}$ 515). Between the local maximum $V_{MAX}$ 510 and minimum $V_{MIN}$ 515 is a region of negative differential resistance (NDR 520).

The bi-stable characteristic of the multi-stable device 10 may be demonstrated as follows. The multi-stable device 10 is turned "off" or set to represent a "0" (i.e., put into its high resistance state) by applying a voltage pulse of magnitude $V_{MIN}$ 515. The voltage pulse should return rapidly to zero voltage or near zero voltage after reaching the magnitude of $V_{MIN}$ 515.

The off-state resistance of the multi-stable device 10 may then be determined by applying a voltage less than $V_{MAX}$ 510 (preferably about half the value of $V_{MAX}$ 510) and measuring the corresponding current passing through the multi-state device 10. The multi-stable device 10 is turned "on" or set to represent a "1" (i.e., put into its low resistance state) by applying a turn-on pulse 526 of magnitude $V_{MAX}$ 510. The voltage pulse should return to zero voltage or near zero voltage after reaching the magnitude of $V_{MAX}$ 510.

The value of the on-state resistance, $R_{on}$, is determined using an applied voltage of magnitude approximately half the value of $V_{MAX}$ 510. The resistance of the multi-stable device 10 in the high resistance "off" state, $R_{off}$, is at least ten times that of the "on" state. Typically, the "off" state resistance may be several orders of magnitude higher that the "on" state resistance. Additional the stable states of the multi-stable device 10 may be set by applying a voltage pulse of magnitude between $V_{MAX}$ 510 and $V_{MIN}$ 515. The on-state resistance $R_{on}$ is expressed per unit area of the intersecting crosspoint point, and is less than 1 kiloOhm.cm$^2$, and preferably less than 1 Ohm.cm$^2$.

Figure 6:
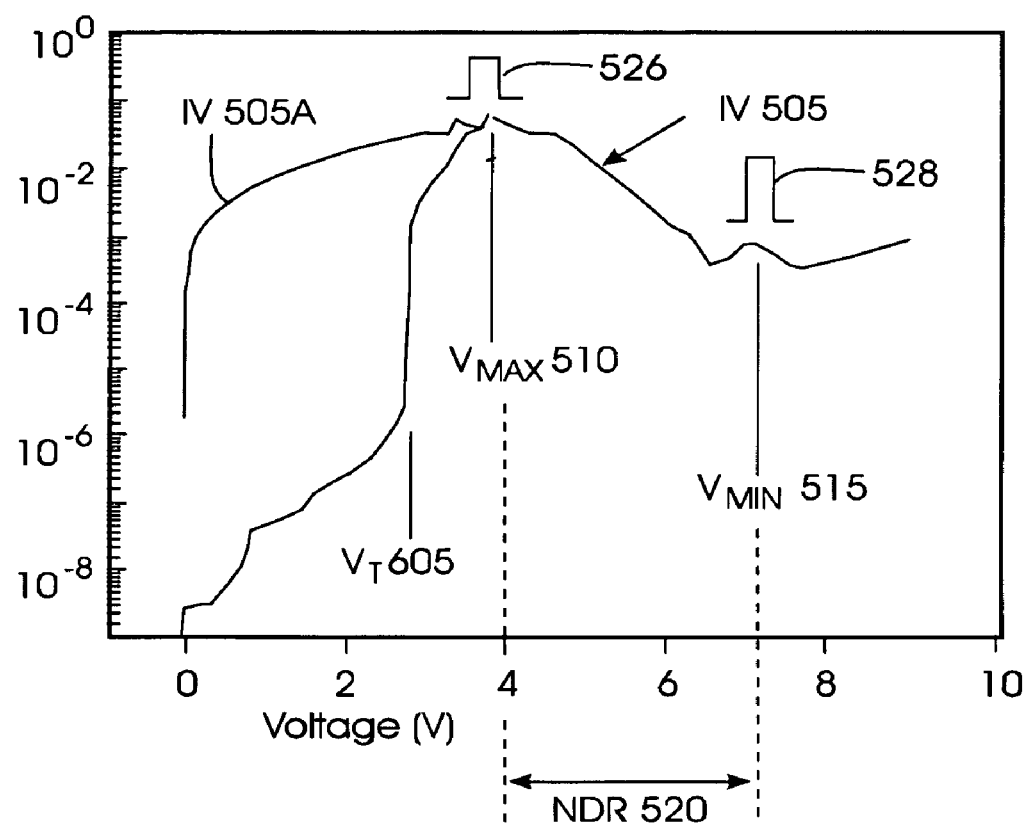
FIG. 6 is a graph illustrating the operation of the multi-stable memory device of FIGS. 1 and 2.

Once the multi-stable device 10 is turned "off" or set to the high resistance, the turn-on behavior may be implemented by ramping the voltage upward, as illustrated by graph IV 505A in FIG. 6. At some threshold voltage, such as $V_T$ 605, the multi-stable device 10 switches "on", meaning that the current rises rapidly to a value consistent with the on-state resistance. The current reaches a maximum value at $V_{MAX}$ 510. Intermediate values of the resistance of the multi-stable device 10 that are between the "on" state resistance and the "off" state resistance may be obtained by "setting" the multi-stable device 10 at a voltage in the region NDR 520 and returning rapidly to zero.

When the multi-stable device 10 is turned "on", few or no charges are stored on the discrete charge storage particles 220, 225, 230. As the voltage is increased in the "on" state, charges (i.e., electrons) are injected from, for example, electrode 35 to electrode 30 without initially charging or "populating" the discrete charge storage particles 220, 225, 230.

As the current increases and more charges enter layer 205, it becomes increasingly probable that the charges occupy the discrete charge storage particles 220, 225, 230. The charges that populate the discrete charge storage particles 220, 225, 230 are immobilized for a time that depends on the applied voltage, and upon the operating temperature.

The trapping properties of the discrete charge storage particles 220, 225, 230 may be tailored by the choice of metal used for the discrete charge storage particles 220, 225, 230, the size of the discrete charge storage particles 220, 225, 230, and their positions in the structure of the multi-stable device 10.

When a sufficient charge has built up on the discrete charge storage particles 220, 225, 230, the resulting space-charge field from the charge trapping layer 215 reduces the injection of new charge at electrode 35. Consequently, the multi-stable device 10 enters the region NDR 520. At still higher voltages, at and above Vmax 510, the electric field at the discrete charge storage particles 220, 225, 230 is sufficient to start releasing the charge stored on the discrete charge storage particles 220, 225, 230, and the current in the multi-stable device 10 starts to flow more freely. Consequently, the optimum voltage for turning off the multi-stable device 10 is that voltage at which the maximum amount of charge is stored within the multi-stable device 10, i.e. close to $V_{min}$ 515.

When the voltage applied to the multi-stable device 10 drops rapidly to a value below the threshold voltage $V_T$ 605, subsequent to the application of a turn-off pulse 528, the trapped charge on the discrete charge storage particles 220, 225, 230 does not have time to leave the discrete charge storage particles 220, 225, 230. In addition, discrete charge storage particles 220, 225, 230 do not touch one another so charge on the discrete charge storage particles 220, 225, 230 is not able to leak away from the area within the crosspoint memory array 100 defined by the multi-stable device 10.

At a sufficiently low voltage, there is not enough electric field to induce charges to leave the discrete charge storage particles 220, 225, 230. Consequently, the multi-stable device 10 can be set to a high resistance at $V_{MIN}$ 515, set to a low resistance at $V_{MAX}$ 510, set to an intermediate resistance by some voltage between $V_{MIN}$ 515 and $V_{MAX}$ 510, and read at a voltage lower than $V_{MAX}$ 510 (i.e., $V_{MAX}$ 510/2). It is noteworthy to emphasize that all these control voltages or pulses 526, 528 are of the same voltage polarity.

Figure 7:
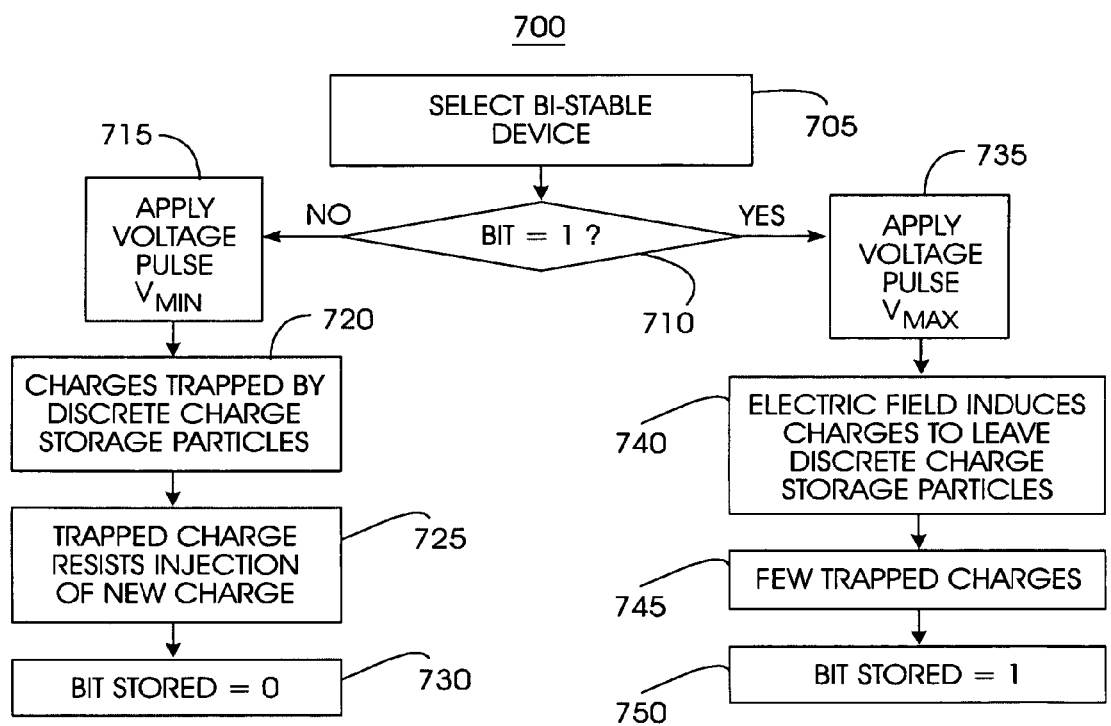
FIG. 7 is a process flow chart illustrating a method of operation of writing to the multi-stable memory device of FIGS. 1 and 2.

A method 700 of writing data to the multi-stable device 10 used in the crosspoint memory array 100, is illustrated by the process flow chart of FIG. 7. At block 705, an external logic circuitry selects the multi-stable device 10 to which data may be written. If at decision block 710 the data bit to be written is "0", a voltage pulse of magnitude $V_{MIN}$ 515 is applied to multi-stable device 10 at block 715. Charges are trapped by the discrete charge storage particles 220, 225,

230 at block 720. At block 725, the trapped charge resists the injection of new charges, presenting a high resistance to any low voltage reading pulses. Consequently, the bit stored is "0" (block 730).

If at decision block 710 the data bit to be written is "1", a voltage pulse of magnitude $V_{MAX}$ 510 is applied to multi-stable device 10 at block 735. At block 740, the electric field from the voltage pulse induces any charges stored on the discrete charge storage particles 220, 225, 230 to leave. At block 745, few charges are trapped, presenting a low resistance to any low voltage reading pulse. Consequently, the bit stored is "1" (block 750).

Figure 8:
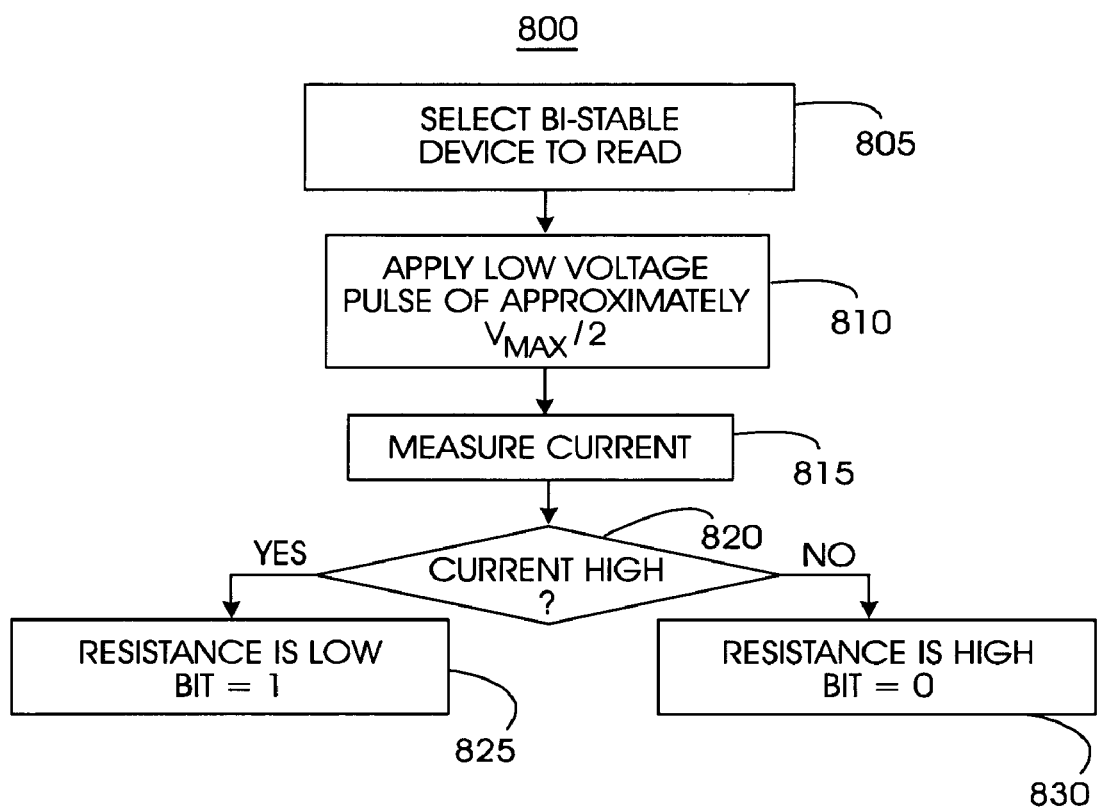
FIG. 8 is a process flow chart illustrating a method of reading from the multi-stable memory device of FIGS. 1 and 2.

A method 800 of reading data stored on the multi-stable device 10 is illustrated by the process flow chart of FIG. 8. At block 805, an external logic circuitry selects the multi-stable device 10 from which data may be read. A low voltage pulse of magnitude on the order of $V_{MAX}$ 510/2 is applied to the multi-stable device 10 at block 805.

The current through the multi-stable device 10 is measured at block 815. If the measured current is determined to be relatively high at decision block 820, the resistance of the multi-stable device 10 is low and the bit stored is deemed to be, for example "1". If, however, the current through the multi-stable device 10 is relatively low as determined at decision block 820, the resistance of the multi-stable device 10 is high and the bit stored is deemed to be "0".

Exemplary materials that may be used in the construction of multi-stable device 10 are shown in TABLE 1 below.

TABLE 1

Exemplary materials that may be used in fabricating the multi-stable device 10 shown in FIG. 2, wherein Alq$_3$ is aluminum triquinolate, ITO is indium-tin-oxide, CuPc is copper phthalocyanine and NPB is N,N'-dinaphthyl-N,N'-diphenylbenzidine. All other symbols are standard representation of the elements, or alloys thereof.

| Example | Electrode 30 | Layer 210 | Charge Trapping Layer 215 | Layer 205 | Electrode 35 |
|---|---|---|---|---|---|
| 1. | Al | Alq$_3$ | Al | Alq$_3$ | Al |
| 2. | Al | Alq$_3$ | Cr | Alq$_3$ | Al |
| 3. | Al | Alq$_3$ | Mg | Alq$_3$ | Al |
| 4. | Al | Alq$_3$ | Ag | Alq$_3$ | Al |
| 5. | Al | NPB | Al | NPB | Al |
| 6. | Ni | Alq$_3$ | Al | Alq$_3$ | Al |
| 7. | Al | Alq$_3$ | Al | Alq$_3$ | Mg:Ag |
| 8. | Cr | Alq$_3$ | Al | Alq$_3$ | Al |
| 9. | ITO | Alq$_3$ | Al | Alq$_3$ | Al |
| 10. | Au | Alq$_3$ | Al | Alq$_3$ | Al |
| 11. | Cu | Alq$_3$ | Al | Alq$_3$ | Al |
| 12. | Al | Alq$_3$ | CuPc | Alq$_3$ | Al |
| 13. | Al | Alq$_3$ | CuPc/Al | Alq$_3$ | Al |
| 14. | Ag | SiO | Ag | SiO | Ag |
| 15. | Ag | SiO | Al | SiO | Al |
| 16. | Cu | SiO | Al | SiO | Al |
| 17. | Ag | SiO | Al | SiO | Au |
| 18. | Au | SiO | Al | SiO | Ag |
| 19. | Au | SiO | Ag | SiO | Ag |
| 20. | Ag | SiO | Al | SiO | Ag |
| 21. | Al | SiO | Al | SiO | Au |
| 22. | Ag | Alq$_3$ | Al | NPB | Al |
| 23. | Al | NPB | Cr | NPB | Al |
| 24. | Al | NPB | Mg | NPB | Al |

Figure 9:
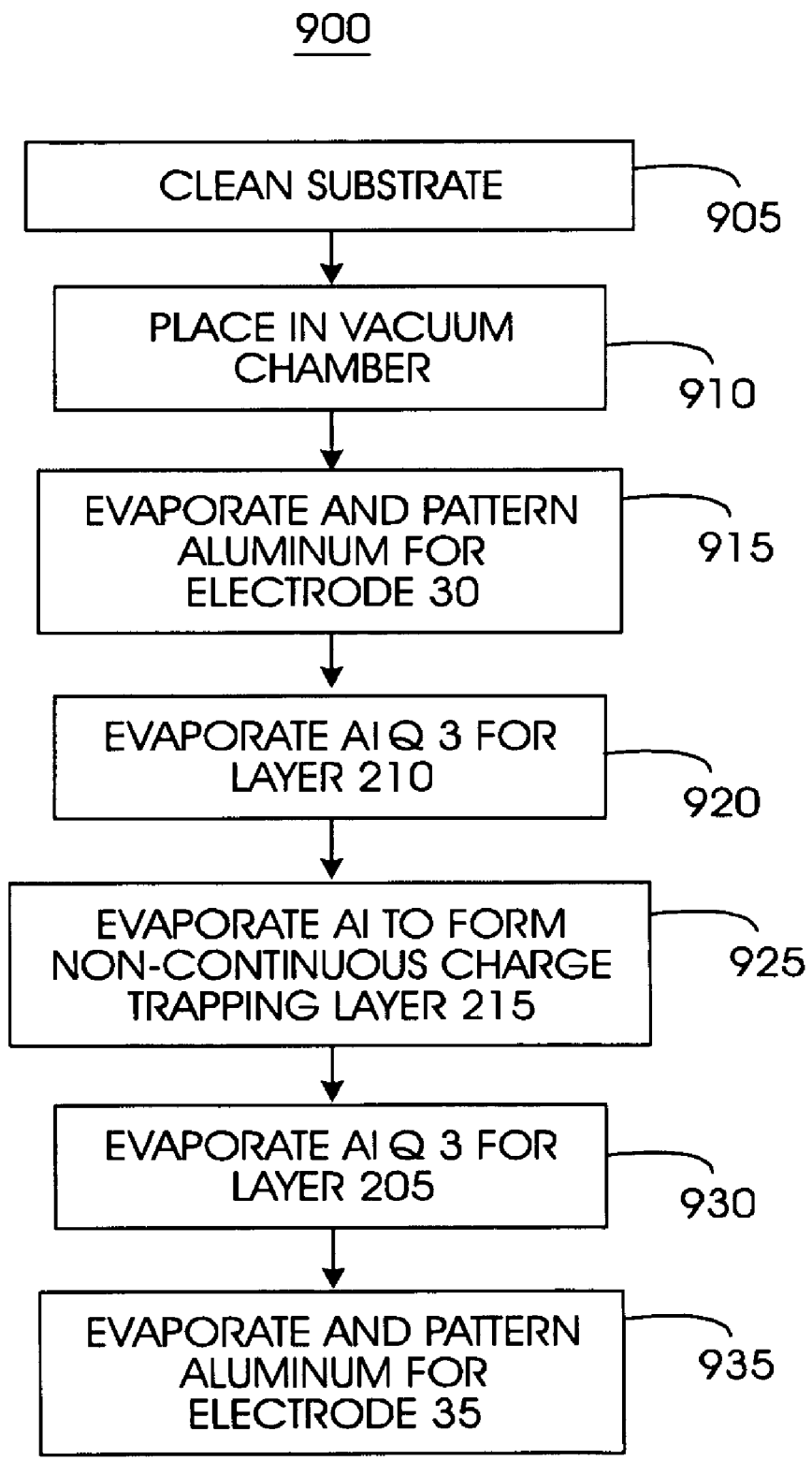
FIG. 9 is a process flow chart illustrating a method of fabricating the multi-stable memory device of FIGS. 1 and 2.

A method of fabrication 900 of the multi-stable devices 10 of a composition illustrated by row 1 in TABLE 1, is exemplified by the process flow chart of FIG. 9. A substrate for multi-stable device 10 is cleaned through several steps at block 905, as follows: wash with acid for 5 minutes, wash with de-ionized water and isopropanol alcohol, then dry for 10 minutes in an oven.

Following the cleaning process, the substrate is moved at block 910 into a vacuum chamber connected to a glove box filled with nitrogen. All the evaporations may be performed at a pressure of $6 \times 10^{-7}$ Torr. A crystal quartz monitor may control the thickness of the layers. Different masks for the various layers are changed breaking vacuum into the inert atmosphere of the glove box. During deposition, the multi-stable device 10 is rotated to insure uniformity of thickness.

A 50 nm layer of aluminum (Al) is evaporated onto the substrate to form electrode 30 at block 915. Layer 210 comprised of aluminum tris (8-hydroxyquinoline) (Alq$_3$) semiconductor is evaporated at block 920. A non-continuous aluminum layer is evaporated at block 925 to form the discrete charge storage particles 220, 225, 230 in charge trapping layer 215. Layer 205 comprised of Alq$_3$ is formed by thermal evaporation at block 930. An aluminum electrode 35 is deposited at block 935 to provide a top contact to the multi-stable device 10.

Figure 10:
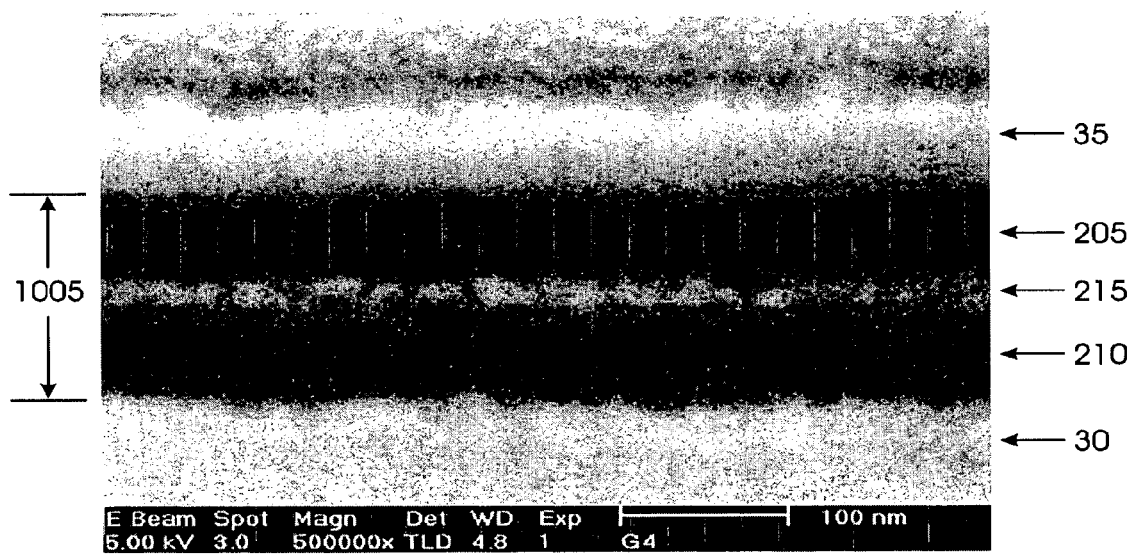
FIG. 10 is a typical SEM cross-section of the multi-stable memory device of FIGS. 1 and 2.

A typical scanning electron microscopy (SEM) cross-section for the multi-stable device 10 is shown in FIG. 10. A 100 nm thick Alq$_3$ layer 1005 is shown sandwiched between aluminum electrodes 30, 35. Aluminum electrodes 30, 35 are 50 nm thick. In the middle of the Alq$_3$ layer 1005, a thin layer of aluminum of thickness 5 nm has been evaporated, corresponding to charge trapping layer 215. The discontinuous nature of the aluminum in charge trapping layer 215 is clearly revealed in the micrograph of FIG. 10.

In general, charge trapping layers 215 that are less than 10 nm thick show a granular structure and a discontinuous profile. Devices with trapping layers that have a granular structure and a discontinuous profile exhibit the multi-stable behavior discussed for multi-stable device 10. Further, devices with no inner metal layer either as a separate charge trapping layer 215 as in FIG. 2 or dispersed throughout the dispersed layer 305 as in FIG. 3 or the dispersed layer 415 as in FIG. 4 do not exhibit switching or multi-stable behavior. Consequently, a discontinuous, granular layer is critical to the multi-stability of multi-stable device 10.

An exemplary multi-stable device 10A comprises a nano-particle based structure, the dispersed layer 305 (FIG. 3). Exemplary materials that may be used in the construction of multi-stable device 10A are shown in TABLES 2 and 3.

Figure 11:
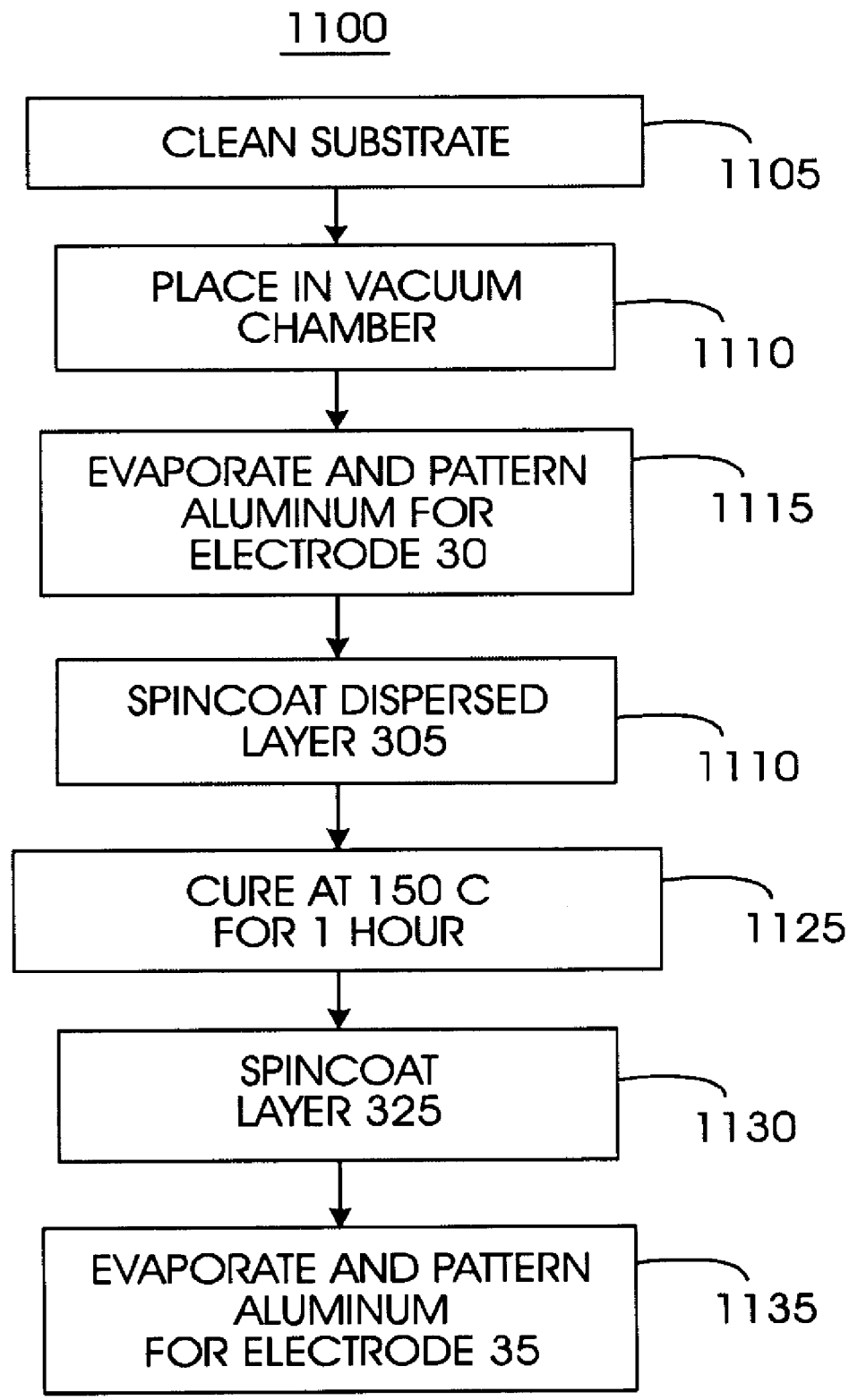
FIG. 11 is a process flow chart illustrating a method of fabricating the multi-state memory device of FIGS. 1 and 3.

A method of fabrication 1100 for multi-stable devices 10A of composition illustrated by example 1 in TABLE 2 is illustrated by the process flow chart of FIG. 11.

TABLE 2

Exemplary materials that may be used in construction of the multi-stable device 10A. DHF is crosslinked poly-9,9-dihexylfluorene, HTPA is crosslinked poly(4-hexyl-triphenylamine-4'4"-diyl). The other materials are as in Table 1.

| Example | Electrode 30 | Dispersed Layer 305 | Discrete Particle | Layer 325 | Electrode 35 |
|---|---|---|---|---|---|
| 1. | ITO | HTPA | Au | NPB | Al |
| 2. | ITO | HTPA | Au | HTPA | Al |
| 3. | ITO | DHF | Au | DHF | Al |
| 4. | ITO | HTPA | Au | HTPA | Ca/Al |
| 5. | ITO | HTPA | Au | Alq$_3$ | Ag:Mg |

TABLE 3 illustrates construction of multi-stable device 10A with the position of the dispersed layer 305 and layer 325 reversed.

TABLE 3

Exemplary materials that may be used in construction of the multi-stable device 10A in which the placement of the dispersed layer 305 and layer 325 are reversed. SAM is a self-assembled monolayer containing phenylene-ethynylene moities. The remaining materials are as previously described in Tables 1 and 2.

| Example | Electrode 30 | Layer 325 | Dispersed Layer 305 | Discrete Particle | Electrode 35 |
|---------|-------------|-----------|---------------------|-------------------|--------------|
| 1. | ITO | DHF | DHF | Au | Al |
| 2. | ITO | HTPA | HTPA | Au | Al |
| 3. | Au | SAM | HTPA | Au | Al |

A substrate for multi-stable device 10A is cleaned through several steps at block 1105, as follows: wash with acid for 5 minutes, wash with de-ionized water and isopropanol alcohol, then dry for 10 minutes in an oven.

Referring to FIG. 11, and following the cleaning process, the substrate is moved at block 1110 into a vacuum chamber connected to a glove box filled with nitrogen. As before, all the evaporations may be performed at a pressure of $6 \times 10^{-7}$ Torr. A crystal quartz monitor may control the thickness of the layers. Different masks for the various layers are changed breaking vacuum into the inert atmosphere of the glove box. During deposition, the multi-stable device 10A is rotated to insure uniformity of thickness.

A 50 nm layer of aluminum (Al) is evaporated onto the substrate to form electrode 30 at block 1115. The dispersed layer 305 is spin coated in the inert nitrogen atmosphere at block 1120. The thickness of the dispersed layer 305 is controlled by selecting the appropriate spinning speed. The dispersed layer 305 is cured at 150 C for one hour at block 1125 to induce crosslinking and allow the spinning of layer 325 without modifying the dispersed layer 305.

At block 1130, layer 325 is spin coated in the inert nitrogen atmosphere. As before, the thickness of layer 325 is controlled by selecting the appropriate spinning speed. An aluminum electrode 35 is deposited at block 1135 to provide a top contact to the multi-stable device 10A.

Multi-stable device 10B of FIG. 4 comprises a nanoparticle based structure as the dispersed layer 415. Exemplary materials that may be used in the construction of multi-stable device 10B are shown in TABLE 4.

TABLE 4

Exemplary materials that may be used in construction of the multi-stable device 10B shown in FIG. 4. All materials are as previously described in Tables 1 and 2.

| Example | Electrode 30 | Layer 405 | Layer 415 | Discrete Particle | Layer 410 | Electrode 35 |
|---------|-------------|-----------|-----------|-------------------|-----------|--------------|
| 1. | ITO | HTPA | HTPA | Au | HTPA | Ca/Al |
| 2. | Al | HTPA | HTPA | Au | HTPA | Al |

Figure 12:
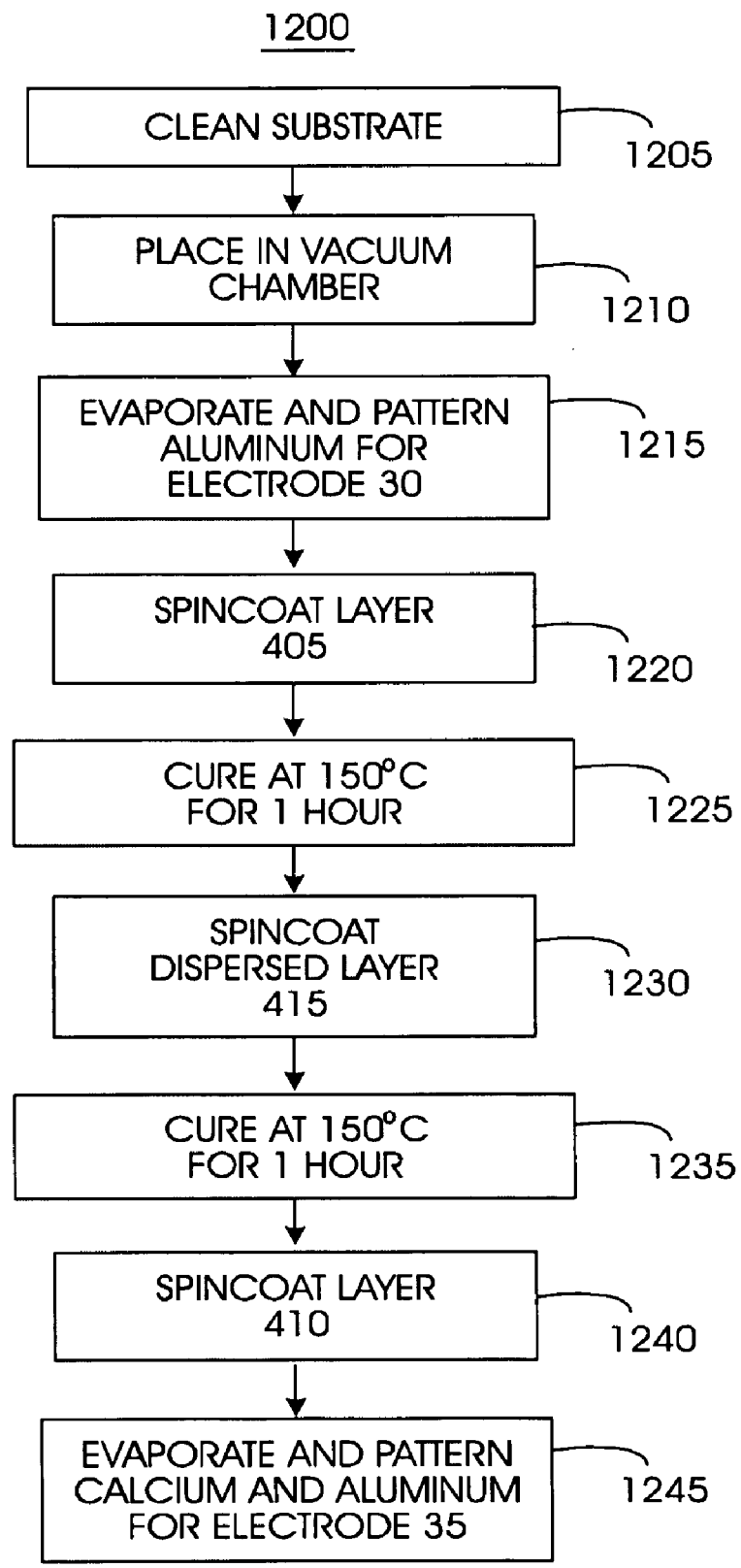
FIG. 12 is a process flow chart illustrating a method of fabricating the multi-state memory device of FIGS. 1 and 4.

A method of fabrication 1200 for multi-stable devices 10B of composition illustrated by row 1 in TABLE 4 is illustrated by the process flow chart of FIG. 12. A substrate for multi-stable device 10B is cleaned through several steps at block 1205, as follows: wash with acid for 5 minutes, wash with de-ionized water and isopropanol alcohol, then dry for 10 minutes in an oven.

Following the cleaning process, the substrate is moved at block 1210 into a vacuum chamber connected to a glove box filled with nitrogen. As before, all the evaporations may be performed at a pressure of $6 \times 10^{-7}$ Torr. A crystal quartz monitor may control the thickness of the layers. Different masks for the various layers are changed breaking vacuum into the inert atmosphere of the glove box. During deposition, the multi-stable device 10B is rotated to insure uniformity of thickness.

A 1500 nm layer of indium-tin-oxide (ITO) is sputter deposited onto the substrate to form electrode 30 at block 1215. Layer 405 is spin coated in the inert nitrogen atmosphere at block 1220. The thickness of layer 405 is controlled by selecting the appropriate spinning speed. Layer 405 is cured at 150 C for one hour at block 1225 to allow the spinning of the dispersed layer 415 without modifying layer 405.

The dispersed layer 415 is spin coated at block 1230 in the inert nitrogen atmosphere. The thickness of the dispersed layer 415 is controlled by selecting the appropriate spinning speed. The dispersed layer 415 is cured at 150 C for one hour at block 1235 to induce crosslinking and allow the spinning of layer 410 without modifying the dispersed layer 415.

At block 1240, layer 410 is spin coated in the inert nitrogen atmosphere. As before, the thickness of layer 410 is controlled by selecting the appropriate spinning speed. The Ca layer is thermally evaporated to form the electrode 35. The aluminum layer is used as the conductor 240, and further to protect the Ca layer.

It is to be understood that the specific embodiments of the invention that have been described are merely illustrative of certain applications of the principle of the present invention. Numerous modifications may be made to the non-volatile multi-stable memory device and method of using the same invention described herein without departing from the spirit and scope of the present invention. Moreover, while the present invention is described for illustration purpose only in relation to memory and storage devices, it should be clear that the invention is applicable as well to, for example, logic devices and switches.

What is claimed is:

1. A method comprising:
   depositing a first electrically conductive layer onto a substrate to form a first electrode;
   depositing a composite medium onto the first electrode; and
   depositing a second electrically conductive layer onto the composite medium to form a second electrode;
   wherein the composite medium comprises a layer of discrete charge trapping particles so that an electrical resistance measured across the first and second electrodes is selectively variable between a lower resistance $R_{on}$ and a higher resistance $R_{off}$;
   wherein $R_{on}$ is selected by applying a turn-on potential $V_{on}$ between the first and second electrodes;
   wherein $R_{off}$ is selected by applying a turn-off potential $V_{off}$ between the first and second electrodes;
   wherein the absolute value of the turn-off potential, $|V_{off}|$, is greater than the absolute value of the turn-on potential, $|V_{on}|$; and
   wherein the turn-off potential, $V_{off}$ and the turn-on potential, $V_{on}$ have the same polarity.

2. The method of claim 1, wherein the composite medium comprises a layer of charge transporting semiconductor material;
   wherein the layer of discrete charge trapping particles is embedded in the layer of charge transporting semiconductor material; and
   wherein the charge transporting semiconductor material includes a primary band gap that ranges between approximately 1.5 eV and approximately 6 eV.

3. The method of claim 1, wherein the charge trapping particles comprise discrete atoms embeded in the layer of charge transporting material.

4. The method of claim 1, wherein the charge trapping particles comprise discrete ions embedded in the layer of charge transporting material.

5. The method of claim 1, wherein the charge trapping particles comprise discrete molecules embedded in the layer of charge transporting material.

6. The method of claim 1, wherein the charge trapping particles comprise discrete molecular clusters embedded in the layer of charge transporting material.

7. The method of claim 1, wherein the charge trapping particles are metallic.

8. The method of claim 2, wherein the charge trapping particles are semiconducting with a band gap less than the band gap of the charge transporting semiconductor material.

9. The method of claim 1, wherein $|R_{on}|$ and $|R_{off}|$ differ by at least a factor of approximatley 2.

10. The method of claim 2, wherein the charge trapping particles form a separate layer within the charge transporting semiconductor material.

11. The method of claim 2, wherein the charge trapping particles are dispersed in the charge transporting semiconductor material.

12. The method of claim 2, wherein the charge transporting semiconductor material comprises a plurality of layers; and
wherein at least one of the plurality of layers comprises a disperson of charge storage particles.

13. A method of forming an electronic device having a first electrode and a Second electrode, comprising:
forming a first electrode;
depositing a composite medium onto the first electrode; and
forming the Second electrode by applying an electrically conductive layer onto the composite medium;
wherein the composite medium comprises a layer of discrete charge trapping particles so that an electrical resistance measured across the first and second electrodes is programmable between a lower resistance Ron and a higher resistance $R_{off}$;
wherein the absolute value of the turn-off potential, $|V_{off}|$, is greater than the absolute value of the turn-on potential, $|V_{on}|$;
wherein the turn-off potential, $V_{off}$ and the turn-on potential, $V_{on}$ have the same polarity;
wherein the composite medium comprises a layer of semiconductor material;
wherein the laver of discrete charge trapping particles is embedded in the layer of Semiconductor material; and
wherein the Semiconductor material includes a primary band gap that ranges between approximately 1.5 eV and approximately 8 eV.

14. The method of claim 13, wherein $R_{on}$ is selected by applying a turn-on potential $V_{on}$ between the first and second electrodes; and
wherein $R_{off}$ is selected by applying a turn-off potential $V_{off}$ between the first and second electrodes.

15. A method of forming a multi-stable non-volatile memory device, comprising:
forming a substrate;
depositing a composite medium onto the first electrode; and
depositing a second electrode onto the composite medium; and
wherein the composite medium comprises a layer of discrete charge trapping particles so that an electrical resistance measured across the first and second electrodes is selectively variable between a lower resistance $R_{on}$ and a higher resistance $R_{off}$;
wherein the composite medium comprises a layer of charge transporting semiconductor material;
wherein the layer of discrete charge trapping particles is embedded in the layer of charge transporting semiconductor material; and
wherein the charge transporting semiconductor material includes a primary band gap that ranges between approximatly 1.5 eV and approximately 6 eV.

16. The method of claim 15, wherein the charge trapping particles are metallic.

17. The method of claim 15, wherein a ratio of resistances of successive stable states of the memory device is at least a factor of 2.

* * * * *